United States Patent [19]

Taylor

[11] 4,381,423
[45] Apr. 26, 1983

[54] HIGH CAPACITANCE BUS BAR MANUFACTURING TECHNIQUE

[75] Inventor: Michael J. Taylor, Mesa, Ariz.
[73] Assignee: Rogers Corporation, Rogers, Conn.
[21] Appl. No.: 249,703
[22] Filed: Mar. 31, 1981
[51] Int. Cl.³ .................. H01B 5/00; H01B 5/14
[52] U.S. Cl. ............................. 174/72 B; 361/306
[58] Field of Search ............ 174/72 B; 361/321, 306; 29/854, 855

[56] References Cited

U.S. PATENT DOCUMENTS 3,074,143  1/1963  Smith .................... 361/321 X
4,236,038 11/1980  Taylor ................... 174/72 B
4,236,046 11/1980  De Vries ............... 361/306 X Primary Examiner—Roy N. Envall, Jr.
Attorney, Agent, or Firm—David S. Fishman

[57] ABSTRACT

A method of assembling a miniaturized bus bar which has high capacitance comprises forming a layer of ceramic material directly upon a bus bar conductor or directly upon a supporting metal strip which is attached to a first bus bar conductor. The exposed surface of the layer of ceramic material is subsequently mechanically and electrically bonded to a second bus bar conductor which extends parallelly with respect to the first bus conductor.

34 Claims, 7 Drawing Figures

U.S. Patent    Apr. 26, 1983    4,381,423
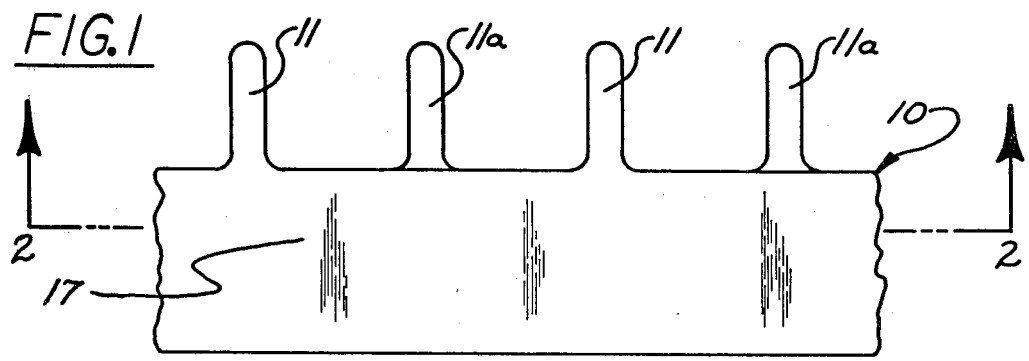
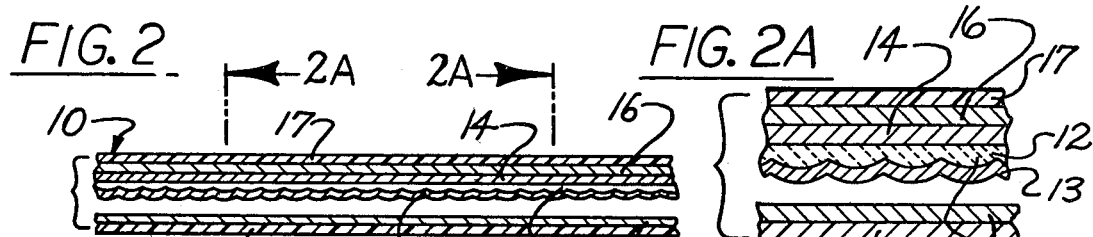
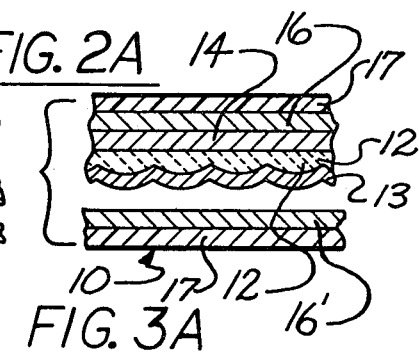
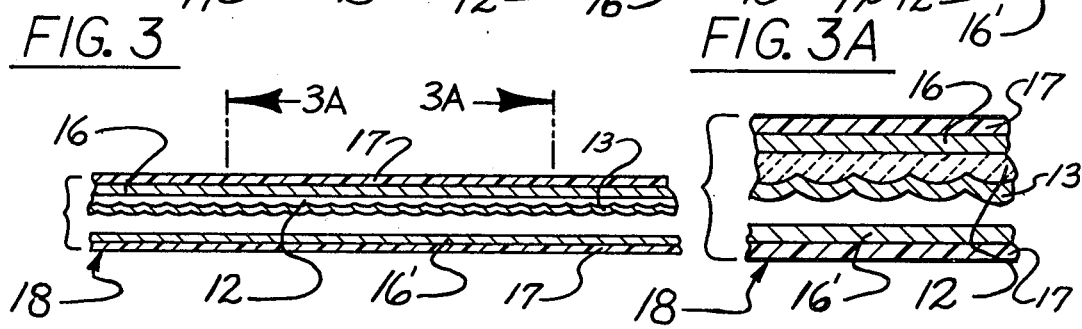
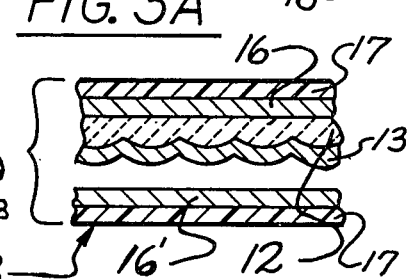
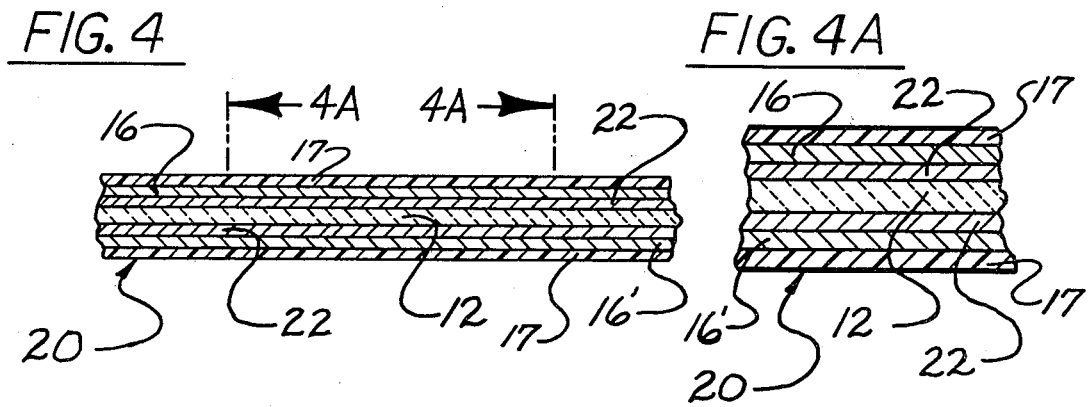
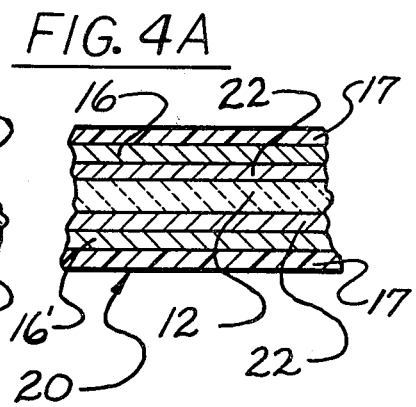

HIGH CAPACITANCE BUS BAR MANUFACTURING TECHNIQUE

BACKGROUND OF THE INVENTION (1) Field of the Invention

This invention relates to bus bars, especially relatively small or miniature bus bars. More particularly, this invention relates to multilayer bus bar assemblies, and the method of manufacture thereof, wherein the bus bar assembly incorporates capacitive elements between layers of bus conductors to provide high capacitance bus bars.

(2) Description of the Prior Art

Conventional bus bars of relatively small or miniature size have been known in the art for a number of years. Such bus bar devices are used for power and/or signal distribution in many systems, such as, for example, computer back panels and integrated circuit systems. Such prior art multilayer bus bars comprise at least two conductive plates (usually in the form of elongated strips or bars or copper) separated by an insulating film. A typical prior art bus bar of this type may use copper conductors having a thickness of about 10 mils, and the overall dimensions of the bus bar may be from about 0.019 to 0.120 inches thick, from about 0.150 to 0.200 inches wide and range in length up to about 16 inches. Typically, the separating insulating layer is a plastic dielectric film such as the polyester material known as MYLAR. The MYLAR separator layer and the conductive plates are bonded together by an adhesive. Conventional prior art bus bars of this type have relatively low capacitance which results in the device being comparatively ineffective in attenuating high frequency noise. This high frequency noise is highly undesirable, especially when the bus bar is used for signal distribution.

One prior art approach to eliminating this noise problem involves connecting capacitors to the bus bar after the completion of the bus bar assembly. While this approach raised the capacitance and minimized the noise, it resulted in additional expense and time in manufacturing.

Another type of bus bar structure disclosed in the prior art involves disposing discrete high capacitive elements between a pair of bus conductors. These bus bars have the desired high capacitance. Examples of such high capacitance bus bars are disclosed in U.S. Pat. Nos. 4,236,038 and 4,236,046 and in patent application Ser. No. 950,266, all of which are owned by the assignee of the present invention. The high capacitive elements utilized in those inventions are thin layers or chips of dielectric material, usually a ceramic with a high dielectric constant. The opposing surfaces of the chips are typically coated with a thin, integral and continuous film of conductive material and these conductive films are electrically connected to respective of the bus conductors.

SUMMARY OF THE INVENTION

The present invention provides novel apparatus for and methods of construction of a miniaturized bus bar which has high internal capacitance.

In accordance with the present invention, a layer of ceramic material is flame sprayed or cast directly upon a bus bar conductor or directly upon a metal strip which may be attached to a bus bar conductor. The opposite side of the ceramic layer is coated with a conductive material and then secured to another bus bar conductor. The ceramic layer and the conductive layers immediately adjacent thereto constitute capacitive ribbons which provide high internal capacitance for the bus bar assembly. In an alternative configuration, a ceramic layer may be cast or flame sprayed upon one metal strip and another metal layer is formed on the exposed ceramic surface to form the capacitor ribbon, and the ribbon may then be secured between a pair of bus bar conductors in any desired manner.

Accordingly, the present invention has among its objectives the provision of novel methods for production of miniaturized bus bars which have high internal capacitance.

BRIEF DESCRIPTION OF THE DRAWINGS

In the drawings, wherein like elements are numbered alike in the several FIGURES:

FIG. 1 is a partial top plan view of a bus bar in accordance with the present invention.

FIG. 2 is an exploded cross-sectional side elevation view of one embodiment of the present invention, taken along line 2—2 of FIG. 1, wherein the ceramic material has been flame sprayed directly upon a supporting metal strip.

FIG. 2A is an enlarged detail of segment 2A—2A of FIG. 2.

FIG. 3 is a view similar to FIG. 2 of an embodiment of the present invention wherein the ceramic material is flame sprayed directly upon a bus bar conductor.

FIG. 3A is an enlarged detail of segment 3A—3A of FIG. 3.

FIG. 4 is a view similar to FIG. 2 of an embodiment of the present invention where the ceramic material is cast or flame sprayed between a pair of metal strips.

FIG. 4A is an enlarged detail of segment 4A—4A of FIG. 4.

DESCRIPTION OF THE PREFERRED EMBODIMENTS

Referring first to FIG. 1, a general view of the overall configuration of a segment of the bus bar 10 is shown. As will be described in more detail hereinafter, the bus bar has first and second conductor elements with signal distribution prongs or fingers 11 and 11(A) projecting from the two conductor elements, respectively.

Referring to FIGS. 2 and 2A, a sectional view of one embodiment of the bus bar 10 of the present invention is seen generally in partial exploded view. A layer of ceramic material 12, barium titanate being a particularly good material for use in the practice of this invention, is flame sprayed or cast directly upon a supporting metal strip 14. Metal strip 14 is then attached to one of a pair of bus bar conductors 16 by any desired method to effect both mechanical and electrical contact between strip 14 and conductor 16. The exposed surface of the layer of ceramic material 12 is then coated with a conductive material 13 (see FIG. 2A). The conductive material 13 used to coat the exposed surface of face of ceramic material 12 may be a conductive adhesive or metalized layer comprised of silver or any other suitable conductive material. The conductive layer 13, the capacitive material 12, and the metal strip 14 combine to form an elongated strip or ribbon capacitor to be contained between the bus bar conductors 16. The second bus bar conductor 16' is secured to the layer of conductive material 13 in any suitable way to effect mechanical and electrical connection between bus bar 16' and conductive layer 13. If the conductive layer 13 is itself a conductive adhesive, then the conductive adhesive may serve the dual purpose of electrical or mechanical connection between layer 13 and bus bar 16'. If layer 13 is a non-adhesive conductive material such as silver, then any suitable method of attachment to effect mechanical and electrical connection between bus bar 16' and layer 13 may be used. Similarly, the attaching or connecting of bus bar conductor 16 to metal strip 14 may be effected by any conventional means such as through the use of a conductive adhesive or otherwise.

In a bus bar configured according to the structure of FIGS. 2 and 2A, the capacitive strip or ribbon formed by metal strip 14, ceramic material 12 and conductive layer 13 defines an internal capacitive strip which is essentially co-extensive with the length and height of the bus bar 10, although the capacitive strip may be configured to be slightly smaller than the main body of bus conductors 16.

With reference to FIGS. 3 and 3A, a second embodiment of the present invention is seen generally at 18. In this second embodiment a layer of ceramic material 12 is flame sprayed or cast directly upon a first bus conductor 16. The exposed surface or face of this layer of ceramic material 12 is coated with the conductive material 13. The second bus bar conductor 16' is then mechanically and electrically connected to conductive material 13 by any suitable method. In the structure of FIGS. 3 and 3A, the capacitive strip or ribbon is defined by the conductive material 13, the dielectric material 12, and one of the bus bar conductors 16. Thus, in the configuration of FIGS. 3 and 3A, one of the bus bar conductors 16 serves the dual purpose of being both one of the bus bar conductors and one of the plates for the capacitive strip or ribbon.

Referring to FIGS. 4 and 4A, a third embodiment of the present invention is generally indicated at 20. In this embodiment a layer of ceramic material 12 is cast or flame sprayed upon one metal strip 22 and a second metal strip is formed on the exposed ceramic surface, whereby the composite of the dielectric material 12 between the two metal strips 22 defines a capacitive strip or ribbon. The second metal strip 22 may be formed by sputtering, electroplating or other techniques. This capacitive strip or ribbon is secured between a pair of bus bar conductors 16 and 16' in any suitable manner to effect mechanical and electrical connection.

As in the configuration of FIGS. 2 and 2A, the configurations of FIGS. 3 and 3A and FIGS. 4 and 4A are such that the capacitive ribbon is essentially co-extensive with the length and height of the main body of the bus bar conductors 16.

In all embodiments of the invention, the outer surfaces of conductors 16 and 16' may be coated with an insulating plastic 17, or the entire assembly may be encapsulated in an insulating plastic.

The method of assembly of the structure of FIG. 2 of this invention is as follows:
 1. Flame spray or cast ceramic material on a metal strip.
 2. Connect the metal strip to a first bus bar conductor for mechanical and electrical contact.
 3. Coat a layer of conductive material on the exposed surface of the ceramic material.
 4. Mechanically and electrically connect a second bus bar conductor to the layer of conductive material on the ceramic material.

The method of construction of the FIG. 3 embodiment of this invention is as follows:
 1. Flame spray or cast ceramic material on one surface of a first bus bar conductor.
 2. Coat a layer of conductive material on the exposed surface of the ceramic material.
 3. Mechanically and electrically connect a second bus bar conductor to the layer of conductive material on the ceramic material.

The method of construction of the FIG. 4 embodiment of this invention is as follows:
 1. Cast or flame spray a layer of ceramic material between two metal strips.
 2. Connect the outer faces of each of the metal strips electrically and mechanically to opposed bus bar conductors.

The flame spraying of the ceramic material in accordance with the present invention may, for example, be performed by plasma spraying or "D-gun" spraying; "D-gun" spraying being a technique available from the Linde Division of Union Carbide Corporation. The "D-gun" spraying involves the propelling of the ceramic powder to the surface of the substrate at a very high velocity. During the coating process the temperature of the surface of the copper substrate must be controlled to prevent the copper from becoming too hot. Because of the different coefficients of expansion of the copper and ceramic, if the copper becomes too hot the substrate will curl during cooling. Acceptable results may be achieved by maintaining a temperature of approximately 2000° F. at the surface of the metal. As will be obvious to those skilled in the art, a critical density of the ceramic will be maintained so that the sprayed coating may function as a capacitor. Also, during flame spraying the connector pins or tabs which extend from the bus conductors (FIG. 3 embodiment) must be protected and this may be accomplished by mounting the conductors on a drum in overlapping fashion to mask pins.

The bus bar conductors of the present invention are copper elements, which may be tin plated; and they are approximately 10 mils thick and range in width or height from about 0.150 to about 0.200 inches and range in length from about 2 to 16 inches, depending on the particular application for the bus bar. The ceramic material from which the capacitive chips or strip capacitors are formed preferably will have a relatively high dielectric constant, a dielectric constant in excess of 8,000 for example, and the thickness of the dielectric material may range from about 125 micro inches to about 250 micro inches and have opposed face surface dimensions in the range of from about 0.2 inches by 0.2 inches to about 0.2 inches by 3.0 inches for individual chips or may extend for the length of the bus bar assembly if in the form of ribbon capacitors.

While preferred embodiments have been shown and described, various modifications and substitutions may be made thereto without departing from the spirit and scope of the invention. Accordingly, it is to be understood that the present invention has been described by way of illustration and not limitation.

What is claimed is:
1. A high capacitance bus bar assembly comprising:
   at least a pair of spatially separated elongated bus bar conductors, said bus bar conductors having inwardly facing planar surfaces;
   a layer of ceramic dielectric material, said layer being disposed between said bus bar conductors, said layer being flame sprayed or flame cast on and in intimate contact with the inwardly facing surface of one of said bus bar conductors; and electrically conductive means on said dielectric layer and connected to the other of said bus bar conductors for establishing electrical contact with the other of said bus bar conductors.

2. The high capacitance bus bar assembly of claim 1 wherein said electrically conductive means includes:
conductive adhesive means, said adhesive means comprising a thin layer in intimate contact with said layer of dielectric material and the inwardly facing surface of the said other bus bar conductor, said adhesive means bonding said layer and the other bus bar conductor together.

3. The high capacitance bus bar assembly of claim 1 wherein said dielectric material is a ceramic.

4. The high capacitance bus bar assembly of claim 3 wherein said ceramic is barium titanate.

5. The high capacitance bus bar assembly of claim 3 wherein said ceramic has a dielectric constant above 8,000.

6. The high capacity bus bar assembly of claim 1 wherein: said layer of dielectric material on said inwardly facing surface of said first bus bar conductor and said electrically conductive means on said dielectric material defines a capacitive strip essentially coextensive with the length and height of said bus bar conductors.

7. The high capacitance bus bar assembly comprising:
at least a pair of spatially separated elongated bus bar conductors;
first conductive metal strip means;
a layer of ceramic dielectric material flame sprayed or flame cast on one surface of said first conductive metal strip means;
the second surface of said conductive metal strip means being connected to one of said bus bar conductors; and
second conductive metal strip means, said second strip means being deposited upon said layer of dielectric material, said second strip means being in electric contact with the other of said bus bar conductors.

8. The high capacitance bus bar assembly of claim 7, including:
conductive adhesive means bonding said first and second conductive metal strip means to said bus bar conductors.

9. The high capacitance bus bar assembly of claim 3 wherein said dielectric material is a ceramic.

10. The high capacitance bus bar assembly of claim 9 wherein said ceramic is barium titanate.

11. The high capacitance bus bar assembly of claim 9 wherein said ceramic has a dielectric constant above 8,000.

12. The high capacity bus bar assembly of claim 7 wherein:
said layer of dielectric material on said first conductive strip means and with said second conductive metal strip means deposited therein defines a capacitive strip essentially coextensive with the length and height of said bus bar conductors.

13. A method of forming a high capacitance bus bar comprising the steps of:
flame spraying or flame casting a layer of ceramic dielectric material upon a first planar surface of an elongated first bus bar conductor;

establishing an electrically conductive surface on the exposed surface of the layer of dielectric material; and connecting a second elongated bus bar conductor to the electrically conductive surface on the layer of dielectric material.

14. The method of claim 13 wherein the step of connecting a second bus bar includes:
applying a layer of conductive adhesive between the second bus bar conductor and the layer of dielectric material; and
curing the adhesive.

15. The method of claim 13 wherein the step of establishing an electrically conductive surface comprises:
forming a metallic layer upon the exposed surface of the layer of dielectric material; and
establishing electrical contact between said metallic layer and said second bus bar conductor.

16. The method of claim 15 wherein the step of includes:
applying a layer of conductive adhesive between the second bus bar conductor and the metallic layer; and
curing the adhesive.

17. The method of claim 13 wherein the step of retaining includes:
applying a layer of conductive adhesive between the second bus bar conductor and the layer of dielectric material; and
curing the adhesive.

18. The method of claim 17 further including:
forming a metallic layer upon the layer of dielectric material; and
placing the second elongated bus bar conductor in electrical contact with the metallic layer.

19. The method of claim 13 wherein:
the step of flame spraying or flame casting a layer of dielectric material includes depositing the dielectric material substantially coextensively with the body of said first bus bar conductor; and
the step of establishing an electrically conductive surface includes establishing the conductive surface on substantially the entire exposed face of the dielectric material.

20. A high capacitance bus bar assembly comprising:
at least a pair of spatially separated elongated bus bar conductors, said bus bar conductors having inwardly facing planar faces;
conductive metal strip means;
a layer of ceramic dielectric material located between said bus bar conductors, said layer of dielectric material being flame sprayed of flame case on one surface of said conductive metal strip means;
the second surface of said conductive strip means being connected to one of said bus bar conductors; and
electrically conductive means on the second face of said dielectric layer and connected to said other of said bus bar conductors for establishing electrical contact with the other of said bus bar conductors.

21. The high capacitance bus bar assembly of claim 20 wherein said electrically conductive means for establishing electrical contact with the other of said bus bar conductors comprises:
a metallic layer deposited upon said layer of dielectric material, said metallic layer being in electric contact with said other bus bar conductor.

22. The high capacitance bus bar assembly of claim 13 wherein said dielectric material is a ceramic.

23. The high capacitance bus bar assembly of claim 22 wherein said ceramic is barium titanate.

24. The high capacitance bus bar assembly of claim 22 wherein said ceramic has a dielectric constant above 8,000.

25. The high capacitance bus bar assembly of claim 20 wherein said dielectric material is a ceramic.

26. The high capacitance bus bar assembly of claim 25 wherein said ceramic is barium titanate.

27. The high capacitance bus bar assembly of claim 25 wherein said ceramic has a dielectric constant above 8,000.

28. A method of forming a high capacitance bus bar comprising the step of:
    flame spraying or flame casting a layer of ceramic dielectric material on a first face surface of a conductive strip;
    connecting another face surface of said conductive strip to a first elongated bus bar;
    establishing an electrically conductive surface on the exposed face of the layer of dielectric material; and
    connecting a second elongated bus bar conductor to the electrically conductive surface on the layer of dielectric material.

29. The method of claim 28 wherein the step of connecting a second bus bar includes:
    applying a layer of conductive adhesive between the second bus bar conductor and the layer of dielectric material; and
    curing the adhesive.

30. The method of claim 28 wherein the step of establishing an electrically conductive surface comprises:
    forming a metallic layer upon the exposed surface of the layer of dielectric material; and
    establishing electrical contact between said metallic layer and said second bus bar conductor.

31. The method of claim 30 wherein the step of retaining includes:
    applying a layer of conductive adhesive between the second bus bar conductor and the metallic layer; and
    curing the adhesive.

32. The method of claim 28 wherein:
    the step of flame spraying or flame casting a layer of dielectric material includes depositing the dielectric material substantially coextensively with the body of said first bus bar conductor; and
    the step of establishing an electrically conductive surface includes establishing the conductive surface on substantially the entire exposed face of the dielectric material.

33. The method of claim 32 wherein the step of retaining includes:
    applying a layer of conductive adhesive between the second bus bar conductor and the layer of dielectric material; and
    curing the adhesive.

34. The method of claim 33 further including:
    forming a metallic layer upon the layer of dielectric material; and
    placing the second elongated bus bar conductor in electrical contact with the metallic layer.

* * * * *